United States Patent [19]
Vijayakumar et al.

[11] Patent Number: 4,751,149
[45] Date of Patent: Jun. 14, 1988

[54] CHEMICAL VAPOR DEPOSITION OF ZINC OXIDE FILMS AND PRODUCTS

[75] Inventors: Pantham S. Vijayakumar; Kimberly A. Blaker, both of Granada Hills; Robert D. Wieting, Simi Valley; Boon Wong, Reseda; Arvind T. Halani, Canoga Park, all of Calif.

[73] Assignee: Atlantic Richfield Company, Los Angeles, Calif.

[21] Appl. No.: 24,871

[22] Filed: Mar. 12, 1987

Related U.S. Application Data

[63] Continuation of Ser. No. 741,081, Jun. 4, 1985, abandoned.

[51] Int. Cl.$^4$ .................... B32B 9/00; B32B 19/00; C23C 16/40
[52] U.S. Cl. .................... 428/702; 427/126.3; 427/255.3; 428/938
[58] Field of Search ............ 427/126.3, 255.3, 255, 427/255.2, 87, 58, 74; 428/702, 938; 430/935

[56] References Cited

U.S. PATENT DOCUMENTS

| | | | |
|---|---|---|---|
| 1,420,888 | 6/1922 | Straw | 427/255.3 |
| 3,081,200 | 3/1963 | Tompkins | 427/126.3 |
| 3,655,429 | 4/1972 | Deklerk | 427/255.3 |
| 3,969,549 | 7/1976 | Williams et al. | 427/255.3 |
| 4,051,276 | 9/1977 | Williams et al. | 427/255.3 |
| 4,105,810 | 8/1978 | Yamazaki et al. | 427/255.3 |

OTHER PUBLICATIONS

Lau et al, "Growth of Epitaxial ZnO Thin Films by Organometallic Chemical Vapor Deposition" J. Electrochem. Soc. vol. 127, No. 8, pp. 1843–1847, 1980.
Shealy et al, "Preparation & Properties of Zinc Oxide Films Grown by the Oxidation of Diethylzinc, J. Electrochem. Soc. vol. 128, No. 3, pp. 558–561, 1981.
Roth et al, "Properties of Zinc Oxide Films Prepared by the Oxidation of Diethyl Zinc, J. Appl. Phys. vol. 52, No. 11, pp. 6685–6692, 1981.
Shimizu et al, "Preparation of ZnO Thin Films by Plasma-Enhanced Organo-Metallic Chemical Vapor Deposition", Thin Solid Films, vol. 96, pp. 149–154, 1982.
Smith, "Metalorganic Chemical Vapor Deposition of Oriented ZnO Films Over Large Areas", App. Phys. Lett. vol. 43:1108–1110, 1983.

Primary Examiner—Sadie L. Childs
Attorney, Agent, or Firm—Nilsson, Robbins, Dalgarn, Berliner, Carson & Wurst

[57] ABSTRACT

Zinc oxide is applied to a substrate at a low temperature by using a mixture of an organozinc compound and water carried in an inert gas. The resulting zinc oxide film has a relatively low resistivity which can be varied by addition of a group III element.

25 Claims, No Drawings

CHEMICAL VAPOR DEPOSITION OF ZINC OXIDE FILMS AND PRODUCTS

This application is a continuation of Ser. No. 741,081, filed June 4, 1985, now abandoned.

BACKGROUND OF THE INVENTION

The present invention relates generally to the deposition of zinc oxide films. In one of its more particular aspects, this invention relates to zinc oxide films useful in photoconductive applications deposited by an improved chemical vapor deposition process.

In many applications where a zinc oxide film is deposited upon a heat-sensitive substrate, such as a photoconductive layer or layers, it is not desirable to deposit the zinc oxide at temperatures which may adversely affect the substrate. Although zinc oxide films have also been produced by chemical vapor deposition, such films have generally been produced only at high temperatures, for example, at temperatures of 350° to 730° C. In addition, films so produced have been characterized by relatively high resistivities.

It is accordingly an object of the present invention to provide a process for depositing a zinc oxide film at a relatively low temperature.

Another object of this invention is to provide such a process in which various additives can be conveniently added to the zinc oxide during deposition of the film to decrease the resistivity thereof.

Other objects and advantages of the present invention will become apparent from the following detailed description.

SUMMARY OF THE INVENTION

The present invention utilizes an improved chemical vapor deposition (CVD) process for depositing zinc oxide films having properties which make them useful in photoconductive applications such as in solar cells and other photovoltaic devices. The process includes introducing an organozinc compound, an oxidant and an inert carrier gas into a chamber containing a substrate heated to a temperature in the range of about 60° to 350° C. The resulting zinc oxide films have a resistivity in the range of about $10^{-4}$ to $10^{-2}$ ohm-centimeter. Such films contain hydrogen and may be fabricated to contain a group III element by introducing volatile group III compounds into the chamber along with the organozinc compound and oxidant.

DESCRIPTION OF THE PREFERRED EMBODIMENTS

In general, the present invention relates to an improved chemical vapor deposition process for depositing doped zinc oxide films upon substrates such as photoconductors. Since many photoconductors are heat sensitive, it is an advantage of this invention that the deposition of zinc oxide, according to the process of the present invention, does not require high temperatures. Another advantage is that the resistivity of the resulting zinc oxide film can be varied by the use of suitable additives. In fact, the resistivity can be varied during the deposition process to produce a film or layer in which the resistivity varies from bottom to top. Another advantage is the low cost of depositing zinc oxide films using the improved CVD process of this invention.

The process is conducted by introducing an organozinc compound, an oxidant, and any desired volatile additive into a chamber containing the desired substrate, which is heated to a temperature within the range of about 60° to 350° C., preferably 100°-200° and more especially to a temperature of about 150° C. By heating the substrate, deposition of zinc oxide upon the walls of the chamber is avoided. In addition, deposition takes place only upon those areas of the substrate which are heated, thus making it possible to deposit a zinc oxide layer upon the entire surface of the substrate or only selected portions thereof.

The system for depositing zinc oxide films in accordance with the present invention utilizes a chamber containing a heated table, means for introducing the reactants into the chamber in gaseous form and a regulated pumping system to provide a dynamic gas flow through the chamber. An organozinc compound and oxidant are carried into the chamber in individual streams of an inert carrier gas. Mixing of the organozinc vapor and oxidant occurs before contact with the heated surface of the substrate in the space between the point of introduction thereof and the heated substrate surface. Reaction between the organozinc compound and oxidant results in decomposition of the organozinc compound to produce zinc oxide, which is deposited upon the substrate as a thin film, with $CO_2$, $CO$ and volatile hydrocarbons as possible byproducts of the reaction. The zinc oxide film contains hydrogen and may contain a group III element where a volatile compound of a group III element is also introduced into the deposition chamber.

Suitable organozinc compounds include zinc dialkyls having the formula $R_2Zn$, wherein R is an alkyl radical, preferably a lower alkyl radical. Dimethyl zinc, $(CH_3)_2Zn$ and diethyl zinc, $(C_2H_5)_2Zn$ are particularly preferred.

Suitable oxidants include water, oxygen, ozone, hydrogen peroxide, nitric oxide, nitrous oxide, nitrogen dioxide, carbon dioxide, sulfur dioxide and other oxygen-containing gases as well as organic oxygen-containing compounds. Representative of suitable organic oxygen-containing compounds are alcohols having the formula, R—OH; ethers having the formula R—O—R'; aldehydes having the formula,

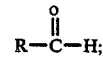

ketones having the formula,

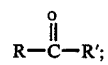

carboxylic acids having the formula,

esters having the formula,

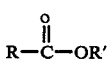

amides having the formula

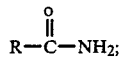

and sulfoxides having the formula

where R and R' are alkyl, preferably lower alkyl, to mention but a few of the possible organic oxidants which might be used.

The composition of the gaseous streams can be varied. The organozinc vapor is produced by vaporizing the organozinc compound into the gas stream, for example by bubbling a stream of inert gas through a reservoir of organozinc compound. Other vaporization methods are equally effective. The mole fraction of the organozinc compound in its carrier gas stream can be up to about 0.5. A mole fraction of about 0.2 is especially preferred.

The oxidant is similarly introduced into the deposition chamber by any suitable method. Bubbling an inert gas through a reservoir of deionized water to produce a mixture of inert carrier gas and water vapor, for example, is an effective method for introducing water vapor. The mole fraction of water vapor or other oxidant in its carrier gas stream can be up to about 0.5.

The proportion of oxidant to organozinc compound can be varied depending upon the particular properties of the zinc oxide film desired. In general, an excess of oxidant is desirable. Films deposited using excess organozinc compound have markedly higher resistivities and display poor adhesion to the substrate. A range of about 1-3 moles oxidant per mole of organozinc compound can be used.

The flow rates of the mixture of inert gas and organozinc compound, and the mixture of the inert gas and oxidant can be varied depending upon the particular mole ratios and partial pressures of reactants which are intended to be reacted at the surface of the substrate. For example, where bubblers are used to introduce the reactants, flow rates of the mixture of the inert gas and organozinc compound and inert gas and oxidant should be in the range of about 5 SCCM to 100 SCCM per square foot of deposition surface.

The inert gas used as a carrier for the organo zinc vapor and the oxidant can be any inert gas, for example, argon or helium, or any gas which is inert under the conditions prevailing in the deposition chamber, such as nitrogen.

Pressures within the deposition chamber in the range of about 0.1 torr to 2 torr have been found to facilitate the deposition process. Pressures can be varied by control of the reactant gas streams or by means of a regulated pumping system.

The hydrogen-containing zinc oxide deposited according to the process of the present invention has been found to have a resistivity in the range of about $10^{-4}$ to $10^{-2}$ ohm-centimeter and a light transmission of greater than 90%. The resistivity can be reduced by adding group III elements to the zinc oxide film. For example, aluminum can be introduced by using trimethyl aluminum, $(CH_3)_3Al$. Similarly, boron can be introduced by utilizing diborane, $B_2H_6$. Gallium and indium can also be used as additives. Addition of about 1-4 mole percent of the selected additive or additives based on the organozinc vapor content has been found to be desirable. Addition of about 2 mole percent is preferred. Where boron is to be incorporated into the zinc oxide film, diborane is introduced in a stream of inert gas, such as argon, along with the organozinc compound and oxidant. Boron-containing zinc oxide layers produced in accordance with the process of the present invention have been found to have resistivities in the range of about $5 \times 10^{-4}$ ohm-centimeter to $2.5 \times 10^{-3}$ ohm-centimeter. Aluminum-containing zinc oxide layers have been found to have resistivities in the range of about $1.0 \times 10^{-3}$ ohm-centimeter to $2 \times 10^{-3}$ ohm-centimeter.

Deposition rates of about 200 Angstroms per minute at 125° C. and 600 Angstroms per minute at 150° C. are readily attainable. Rates are also controlled in part by gas flow rates and partial pressures of reactants. Zinc oxide films can be deposited to any desired thickness by controlling the time and rate of deposition. Typical films are 1-2 microns thick. The polycrystalline boron containing zinc oxide formed is found to have an X-ray diffraction pattern corresponding predominantly to (002) orientation with respect to the plane of the substrate, whereas aluminum containing zinc oxide has (100) preferred orientation.

By means of the process of the present invention, it is thus possible to deposit large areas of zinc oxide and to control the resistivity thereof. In this manner, for example, conductive zinc oxide layers for use in solar cells can be readily deposited. Depending upon the particular additive utilized in the process, it is also possible to produce other zinc oxide layers for use in photoconductive devices and having varying physical and electrical properties.

While certain specific embodiments of the invention have been disclosed as typical, the invention is, of course, not limited to these particular forms, but rather is applicable to all such variations as fall within the scope of the intended claims. For example, other group III additives than aluminum and boron can be used to provide zinc oxide layers having varying properties. In addition, various other reaction conditions than those specifically mentioned above can be used in the process of the present invention.

What is claimed is:

1. A process for depositing a zinc oxide film on a substrate, which comprises introducing an organozinc compound vapor, water vapor and an insert carrier gas into a chamber containing a substrate heated to a temperature of up to about 200° C. to deposit a zinc oxide film having a resistivity of less than about $2.5 \times 10^{-3}$ ohm-centimeter on the substrate in the absence of plasma-enhanced deposition.

2. The process of claim 1 wherein the organozinc compound has the formula $R_2Zn$, with R being an alkyl radical.

3. The process of claim 1 wherein the organozinc compound is dimethylzinc.

4. The process of claim 1 wherein the organozinc compound is diethylzinc.

5. The process of claim 1, 2, 3 or 4 wherein the film has a thickness of up to about 2 microns.

6. The process of claim 1, 2, 3 or 4 wherein the film is formed by introducing into the chamber an organozinc compound vapor in an amount of up to about 0.5 mole fraction in its inert carrier gas stream, and water vapor in an amount of about one to three moles per mole of organozinc compound.

7. The process of claim 6 wherein the film has a thickness of up to about 2 microns.

8. A process for depositing a zinc oxide film on a substrate, which comprises introducing an organozinc compound vapor, water vapor and an inert carrier gas into a chamber containing a substrate heated to a temperature of up to about 150° C. to deposit a zinc oxide film having a resistivity of less than about $2.5 \times 10^{-3}$ ohm-centimeter and a thickness of up to about 2 microns on the substrate in the absence of plasma-enhanced deposition.

9. The process of claim 8 wherein the organozinc compound has the formula $R_2Zn$, with R being an alkyl radical.

10. The process of claim 8 wherein the organozinc compound is diemthylzinc.

11. The process of claim 8 wherein the organozinc compound is diethylzinc.

12. A process for depositing a zinc oxide film containing a group III element on a substrate, which comprises introducing an organozinc compound vapor, water vapor, a volatile compound of a group III element and an inert carrier gas into a chamber containing a substrate heated to a temperature of about 100° C. to 200° C. to deposit a zinc oxide film having a resistivity of less than about $2.5 \times 10^{-3}$ ohm-centimeter on the substrate in the absence of plasma-enhanced deposition.

13. The process of claim 12 wherein the organozinc compound has the formula $R_2Zn$, with R being an alkyl radical.

14. The process of claim 12 wherein the organozinc compound is dimethylzinc.

15. The process of claim 12 wherein the organozinc compound is diethylzinc.

16. The process of claim 12, 13, 14 or 15 wherein the group III element is boron and the volatile compound is diborane.

17. The process of claim 12, 13, 14 or 15 wherein the film is formed by introducing into the chamber an organozinc compound vapor in an amount of up to about 0.5 mole fraction in its insert carrier gas stream, water vapor in an amount of about one to three mole per mole of organozinc compound, and the volatile compound in an amount of about one to four mole percent of the organozinc compound.

18. The process of claim 17 wherein the film has a thickness of up to about 2 microns.

19. A process for depositing a zinc oxide film containing boron on a substrate, which comprises introducing: (a) an organozinc compound vapor selected from the group consisting of dimethylzinc and diethylzinc, (b) water vapor, (c) diborane and (d) an inert carrier gas into a chamber containing a substrate heated to a temperature of up to about 200° C. to deposit a zinc oxide film having a resistivity of less than about $2.5 \times 10^{-3}$ ohm-centimeter on the substrate in the absence of plasma-enhanced deposition, the water being introduced in a proportion of about one to three moles per mole of the organozinc compound and the diborane being introduced in an amount of about one to four mole percent of the organozinc compound.

20. A zinc oxide film having a resistivity of less than $2.5 \times 10^{-3}$ ohm-centimeter and which is characterized by having been deposited on a substrate by the introduction of an organozinc compound vapor, water vapor and an inert carrier gas into a chamber containing a substrate heated to a temperature of up to about 200° C. to deposit the film on the substrate in the absence of plasma-enhanced deposition.

21. The film of claim 20 wherein the organozinc compound has the formula $R_2Zn$, with R being an alkyl radical.

22. The film of claim 20 wherein the organozinc compount is dimethylzinc.

23. The film of claim 20 wherein the organozinc compound is diethylzinc.

24. The film coated substrate of claim 20, 21, 22 or 23 wherein the film has a thickness of up to about 2 microns.

25. A zinc oxide film having a resistivity of less than $2.5 \times 10^{-3}$ ohm-centimeter and a thickness of up to 2 microns, and which is characterized by having been deposited on a substrate by the introduction of: (a) an organozinc compound vapor selected from the group consisting of dimethylzinc and diethylzinc, (b) water vapor, (c) diborane and (d) an inert carrier gas into a chamber containing the substrate heated to a temperature of up to about 200° C. in the absence of plasma-enhanced deposition, the water vapor being introduced in a proportion of about one to three moles per mole of the organozinc compound and the diborance being introduced in an amount of about one to four mole percent of the organozinc compound.

* * * * *